(12) United States Patent
Bolde

(10) Patent No.: US 6,182,356 B1
(45) Date of Patent: *Feb. 6, 2001

(54) APPARATUS FOR SOLDER BALL MOLD LOADING

(75) Inventor: Lannie R. Bolde, New Paltz, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/977,523

(22) Filed: Nov. 24, 1997

(51) Int. Cl.[7] .................................................. B23P 19/20
(52) U.S. Cl. .............................. 29/821; 29/464; 228/41; 53/247
(58) Field of Search ............................. 53/235, 244, 246, 53/247, 249, 529; 228/41, 246; 100/210; 29/464, 821; 221/69

(56) References Cited

U.S. PATENT DOCUMENTS

| | | | |
|---|---|---|---|
| 2,847,809 | * | 8/1958 | Lindeman et al. . |
| 4,149,355 | * | 4/1979 | Clegg ................................. 53/246 X |
| 4,248,027 | * | 2/1981 | Cleary et al. .......................... 53/244 |
| 5,279,045 | | 1/1994 | Odashima et al. . |
| 5,394,670 | * | 3/1995 | Visser .................................... 53/249 |
| 5,431,332 | * | 7/1995 | Kirby et al. .......................... 228/246 |
| 5,467,913 | | 11/1995 | Namekawa et al. . |
| 5,540,377 | | 7/1996 | Ito . |
| 5,607,099 | | 3/1997 | Yeh et al. . |
| 5,620,927 | | 4/1997 | Lee . |
| 5,735,195 | * | 4/1998 | Hewitt et al. .......................... 100/65 |

* cited by examiner

*Primary Examiner*—S. Thomas Hughes
*Assistant Examiner*—John C. Hong
(74) *Attorney, Agent, or Firm*—Ratner & Prestia; Aziz M. Ahsan, Esq.

(57) ABSTRACT

A method and apparatus for loading solder balls into a mold. Solder balls are loaded into a reservoir having multiple exit ports. A removable mold is fitted into the apparatus and the reservoir is passed across the top of the mold while solder balls are fed into cavities in the mold. After the reservoir has advanced across the mold and the mold cavities are filled with solder balls, the reservoir is reset as a roller is simultaneously guided across the mold to seat the solder balls firmly within the mold. Alternatively, the roller may be applied to the solder balls while the reservoir advances across the mold, or both as the the reservoir is advanced and when it is returned to its original position.

13 Claims, 6 Drawing Sheets

APPARATUS FOR SOLDER BALL MOLD LOADING

FIELD OF INVENTION

The present invention relates generally to the attachment of solder balls to semiconductor packages such as ball grid arrays. More particularly, this invention describes a method and apparatus for the placement of solder balls into a mold prior to attachment to a substrate.

BACKGROUND OF THE INVENTION

The complexity, functionality, size, and speed of integrated circuit (IC) chips has been increasing as technological advancements allow improvements in all areas of IC use and manufacture. These advancements have also led to increasing numbers of electrical interconnections on the IC chips. The competing forces of smaller size and increased interconnections led to the development of the ball grid array (BGA) and subsequent improvements in that structure have followed continuously since its creation.

In manufacturing semiconductor packages that utilize arrays of solder balls such as BGAs, one of the difficulties encountered is accurately and efficiently aligning and attaching the solder balls to the bottom of the substrate. Various attempts have been made, with differing levels of success, to develop techniques to perform the ball attaching process. Several current methods involve the preliminary step of placing solder balls into a mold or stencil before attaching the balls to the substrate. This preliminary step aids in achieving both quality control objectives and high production requirements.

A typical manual operation uses a fixture consisting of a flat plate having a central cavity within it, approximately the size of the mold, and a raised border around all four sides. A mold is placed in the plate cavity which supports the mold with a minimal gap between the cavity and mold edges. In addition, the plate cavity depth is equal to the height of the mold so that the top surface of the mold is in the same plane as the top surface of the flat plate. Next, loose balls are placed in the fixture. The fixture initially is tilted in one direction approximately 15 to 20 degrees. This allows the loose balls to roll to the low side of the slope. After the fixture is tilted, a vacuum is drawn under the plate cavity and the fixture is tilted in the opposite direction. As the loose balls pass over the mold, empty ball cavities within the mold are filled and the balls are held in place by the pressure differential through the mold cavities. This sequence is repeated until all of the mold cavities are filled with balls. The mold is then removed from the plate cavity and a manual flattening operation is performed.

The manual flattening operation consists of an operator using a hand-held steel roller approximately one inch in diameter. The operator firmly applies the roller over the surface of the mold with the balls seated in the cavities. The mold cavities are configured such that the balls, prior to flattening, extend slightly above the top plane of the mold. The rolling action deforms the balls, which seats the balls firmly into the mold cavities while simultaneously forming a small flat spot on the top of each ball. Moreover, the rolling step causes the balls to be compressed such that the flat spot of each ball is now in the same plane as the top plane of the mold. Thus, the top surface of the balls seated in the cavity and the interstitial surface space of the mold between cavities combine to form a solid, single plane surface. This step completes the process of preparing a mold with balls in a ball grid array format for the subsequent step of applying a metered amount of solder paste to the top of each ball. That step is then followed by attaching the balls to a substrate.

Conventional automated tooling machines for placing balls into a mold utilize methods similar to manual processes. Included in the list of past advancements are the automation of special handling units and vision systems which utilize cameras to detect cavities in the mold which were not properly filled with a solder ball. These methods typically involve two distinct stations. The first station loads the balls into a mold. The mold is then removed from the loading apparatus and, at the second station, the balls are secured in the cavities such that they are all partially flattened and held in place until attached to a substrate, at which time the mold is discarded or reused.

All of the above methods require a two-part process with time spent between steps to move the mold and orient it for the second step of seating the balls. In addition, the first step of typical methods involves random placement of the balls into the mold cavities. This randomness, even if the first step is repeated, often results in vacant cavities. These aspects of the prior manufacturing techniques make them time and labor intensive, which, in turn, makes them more expensive than a method which alleviates the time and labor intensive elements of production.

The deficiencies of the conventional manufacturing techniques show that a need still exists for a method which will accurately and reliably place solder balls into a mold before attachment to a substrate. Therefore, one object of the present invention is to provide a method and automated apparatus to accurately place solder balls into a solder ball mold. Another object of the present invention is to provide a ball flattening step that is nearly simultaneous with the ball placement step, thus shortening the time involved for overall mold preparation.

SUMMARY OF INVENTION

To achieve these and other objects, and in view of its purposes, the present invention provides a loading method and apparatus for automatically loading preform solder balls into molds in preparation for attachment to a substrate. This invention also includes a nearly simultaneous step that flattens the balls once placed in the mold. This flattening step is performed as the apparatus used in the first step of placing the balls into the mold cavities is being reset, and does not require the mold to be moved from the position it occupied during the first step. Automating an accurate ball placement apparatus and additionally providing a flattening step which does not require time to be spent reorienting the mold after ball placement will improve the cost effectiveness of solder ball loading molds.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Typically, the first step in attaching multiple solder balls to a substrate is to temporarily attach the balls to a mold and later transfer those balls from the mold to the substrate. The present invention is a loading method and apparatus for automatically loading preformed solder balls into molds in preparation for attachment to a substrate.

Figure 1:
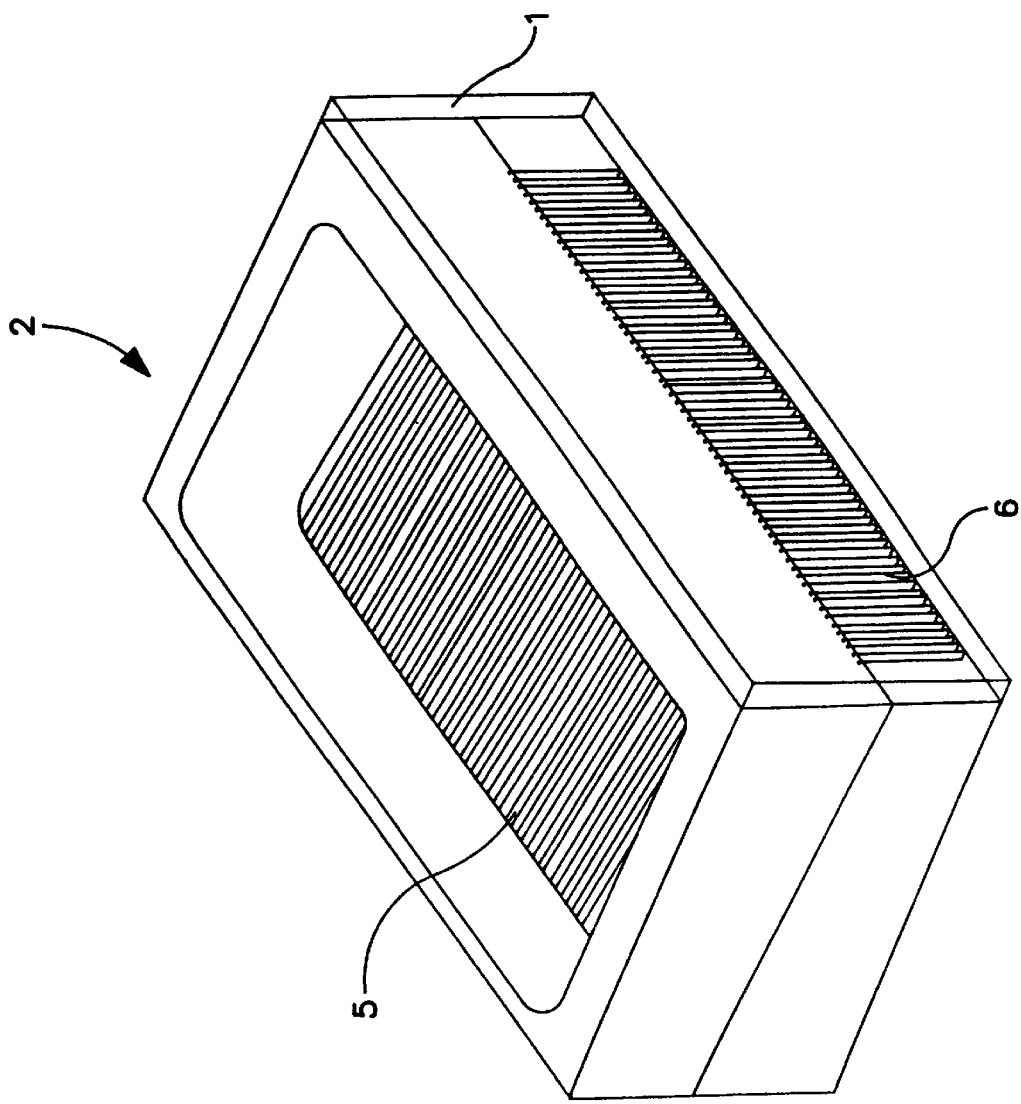
FIG. 1 illustrates an isometric view of the reservoir device according to the present invention.
Figure 1:
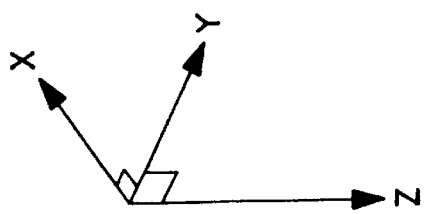

The first step of the method of the present invention is to load a multitude of solder balls into a reservoir device. FIG. 1 illustrates such a reservoir 2. The reservoir 2 is constructed with channels 5 running along the bottom surface of the reservoir 2 in the y-direction. These channels 5 are sized to accept solder balls and guide them to the feeder exit ports 6.

Figure 2:
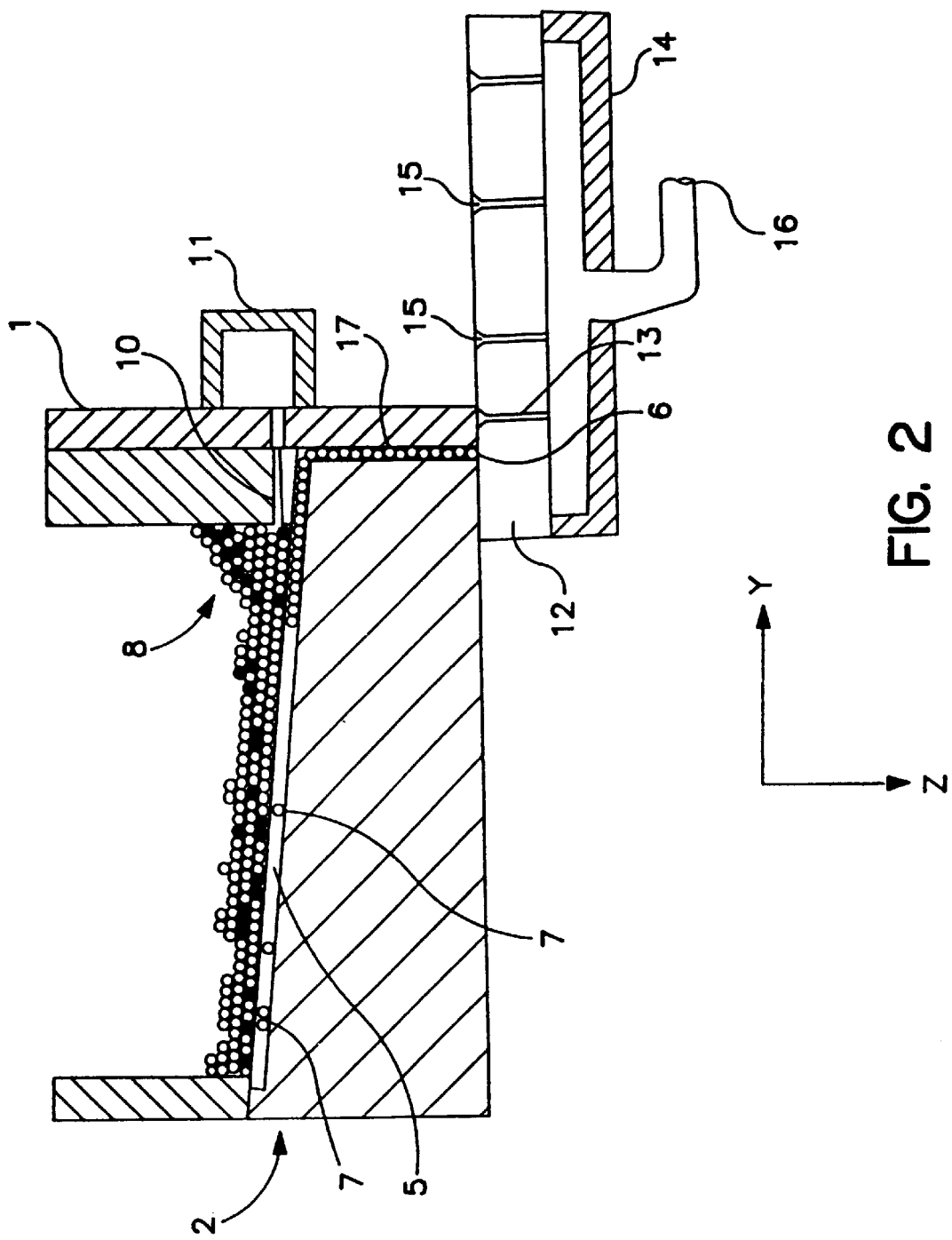
FIG. 2 illustrates a cross-sectional view of the reservoir, vacuum chuck, and mold according to the present invention.

FIG. 2 shows a cross sectional view of a channel 5 and a feeder exit port 6. Each feeder exit port 6 has a corresponding channel 5. Acting under the force of gravity, the balls in the reservoir 2 enter the channels 5 and are transferred to the exit ports 6. Balls which are not accepted into an available spot in a channel are moved around in the reservoir 2 until a spot in a channel becomes available. Vertical column 17 is shown in the exemplary embodiment of FIG. 2. The column 17 is provided to increase the force on the ball at the feeder exit port 6. This helps insure that a solder ball will enter a vacant cavity in a mold 12 as the reservoir 2 passes over mold 12.

Figure 3:
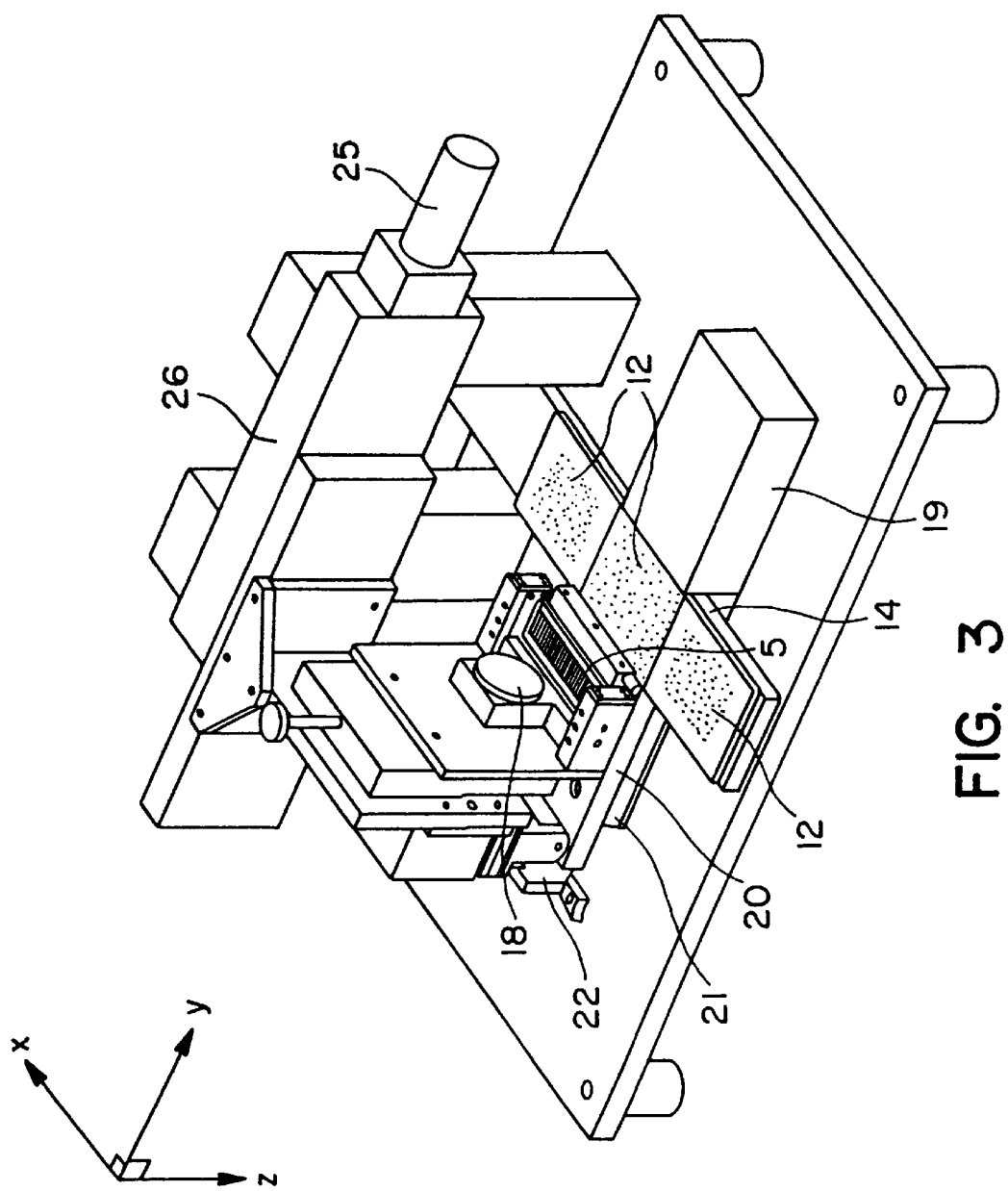
FIG. 3 illustrates an isometric view of the present invention.

An air manifold 11 is provided in the exemplary embodiment shown in FIG. 2. Air is pumped through this manifold and into the reservoir 2 through inlet line 10 to break up the accumulation of balls 8 at the bottom region of the reservoir 2. In addition to the air agitation, a vibrator 18 is placed on the reservoir 2 as shown in FIG. 3. Vibrator 18 further breaks up blockages and assists movement of balls in the reservoir 2. Vibco, Inc. provides typical industrial vibrators suitable for this purpose.

Figure 4:
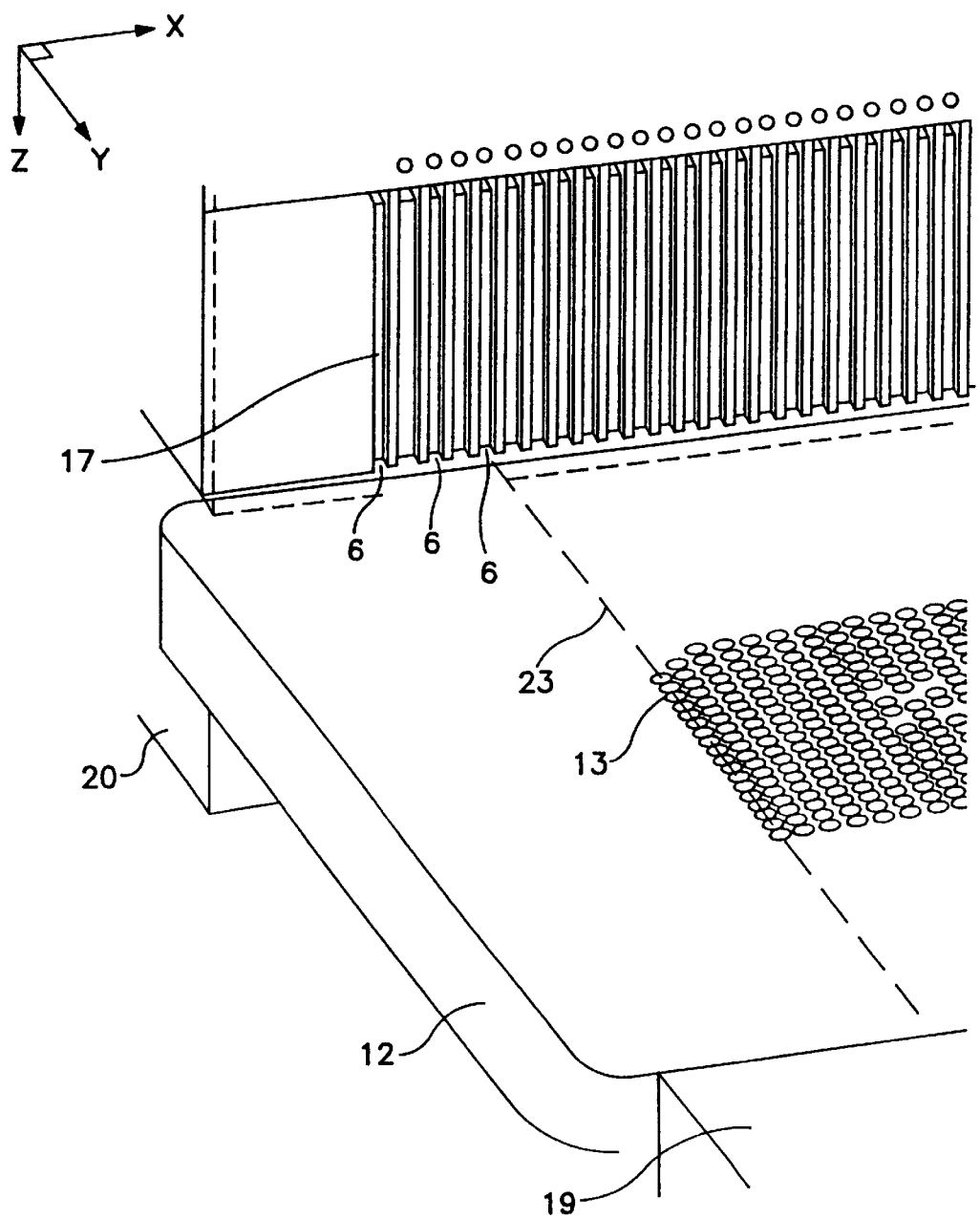
FIG. 4 illustrates a close-up isometric view of the feeder exit ports and top surface of the mold, according to the present invention.

FIG. 1 also shows clear cover plate 1 which serves two purposes. First, it forms the front wall of vertical columns 17 and feeder exit ports 6, and second, it allows an operator to view ball movement through the feeder exit ports 6. FIG. 4 shows the row of feeder exit ports 6 in the x-direction. As the reservoir is moved across the mold 12, balls which are lined up in the feeder exit ports are allowed to drop into vacant cavities 13 in the mold 12. This process is explained further with reference to FIGS. 2, 3, 4, and 5.

FIG. 2 shows a cross-sectional view of the reservoir 2, and also the vacuum chuck 14 upon which a mold 12 is placed prior to ball placement. Mold 12 has cavities 13 through which air is drawn by a pump (not shown) on vacuum line 16. In the method of the present invention, the reservoir 2 is moved across the mold 12 and solder balls 7 fall out of the feeder exit ports 6 and into the cavity mouths 15. The solder balls 7 are held in place by the vacuum as the reservoir 2 advances past the remaining vacant cavities 13. The reservoir 2 is moved by a swing arm 26 powered by a stepper motor 25, as shown in FIG. 3.

The mold 12 is held in place by several plates. FIG. 3 shows fixed plate 19 which secures the mold 12. FIG. 3 also illustrates the preferred embodiment where a continuous flow of molds occurs through the machine. As one mold is loaded and then moved forward, the empty mold behind it is moved into position. Adjustable clamping plate 20 is mounted to a slide 21. A typical slide, suitable for this purpose, is provided by Del-Tran, Inc. Before the reservoir 2 is advanced across mold 12, clamping plate 20 is fitted up against mold 12 to secure mold 12 in place against fixed plate 19. The clamping plate 20 is driven along the slide 21 by an air cylinder 22. A typical air cylinder suitable for this purpose is available from Bimba Manufacturing Co. In the preferred embodiment, the mold 12 is held in place on its other two sides by the mold behind it and a mold in front of it. Alternatively, the mold may be held in place on those sides by additional plates (not shown). Plates 19 and 20 are dimensioned such that the plane defined by the top surface of the plates contains the top surface of the mold 12. Moreover, the top of the mold 12 lines up with the top of the plates, providing a flat surface over which the reservoir 2 may advance.

Figure 5:
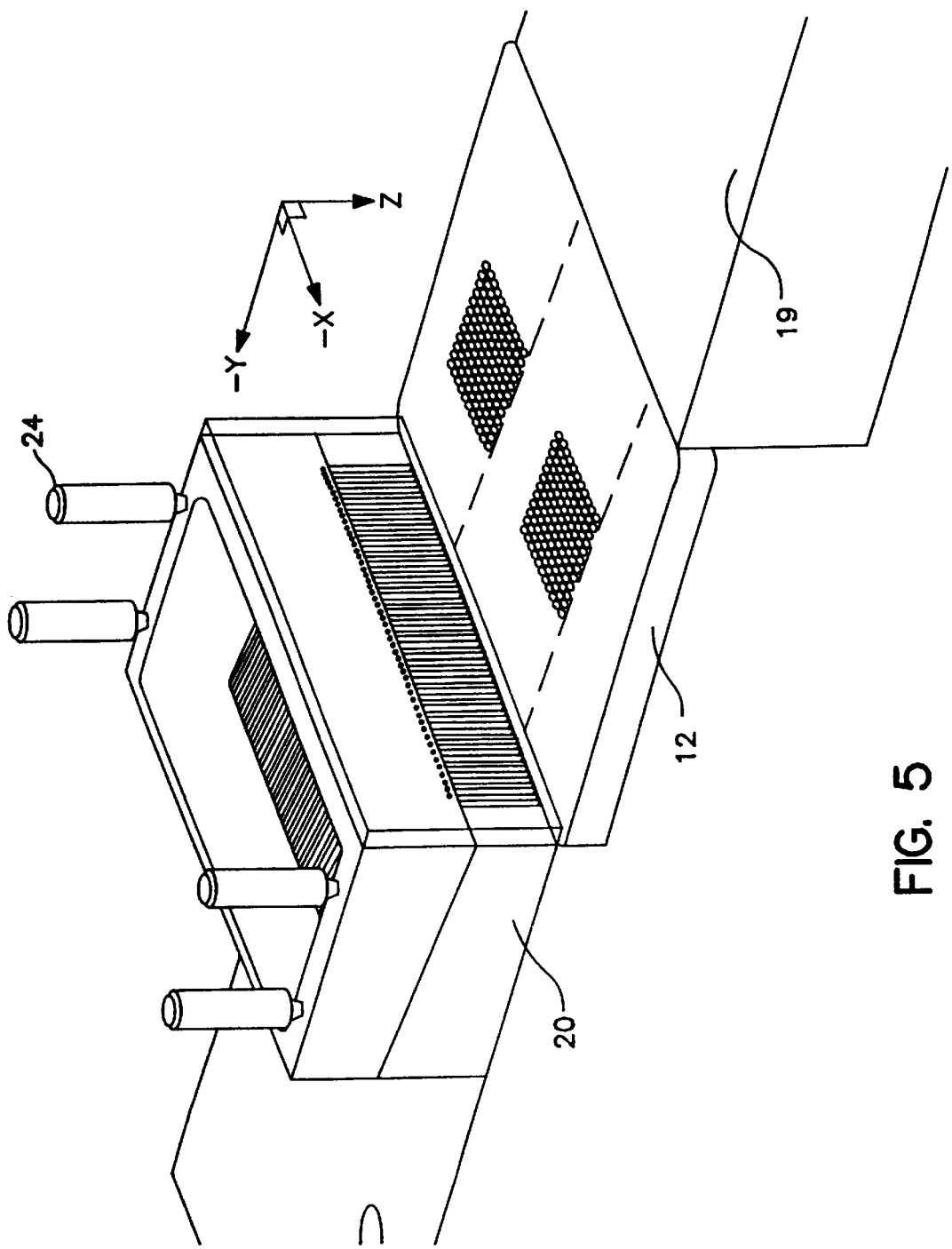
FIG. 5 illustrates the reservoir device and mold, according to the present invention.

Prior to advancing the reservoir 2 over the mold 12, the reservoir 2 is aligned such that the center line of all cavities 13 in the y-direction are lined up with the center lines of the feeder exit ports 6, as shown diagramatically by an example centerline 23 in FIG. 4. FIG. 5 illustrates spring plungers 24 which are used to apply pressure to the reservoir 2 and insure that the feeder exit ports 6 are fitted tightly against the mold 12, even as the reservoir 2 vibrates during movement across the mold 12. Typical spring plungers suitable for this purpose are available from Read Tool Supply or Carr Lane Mfg. Co.

Once the above preparations have been made, the reservoir 2 is advanced across the top of the mold 12 and solder balls are allowed to fill the cavities 13 by resting within cavity mouths 15. The balls are held in place by the vacuum drawn by the vacuum chuck 14. The cavity mouths 15 are sized such that the solder balls extend slightly above the top plane of the mold 12. The next step accomplished by the apparatus of the present invention is a solder ball flattening step.

Figure 6:
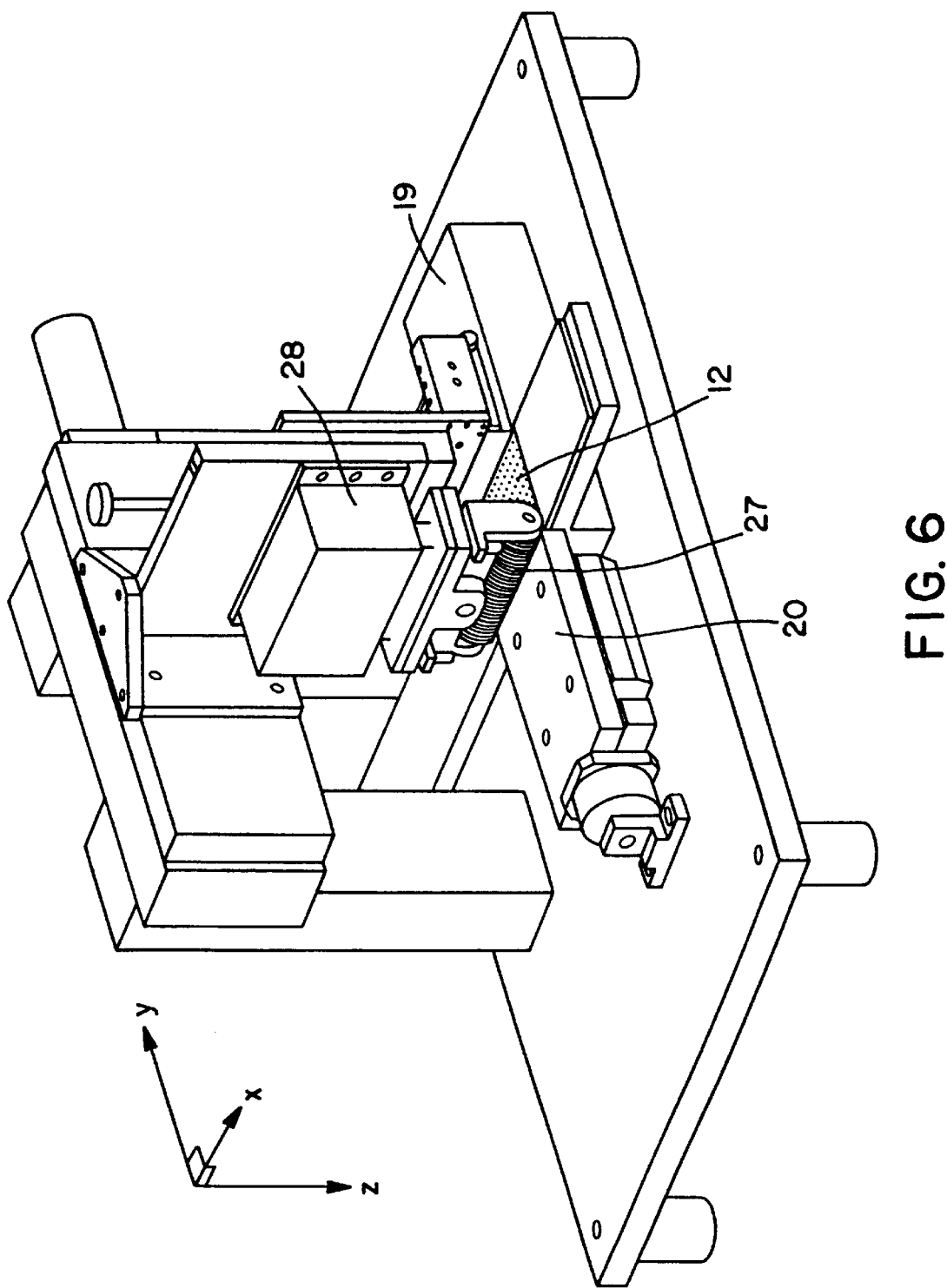
FIG. 6 illustrates an isometric view of the present invention from a different angle than that of FIG. 3.

FIG. 6 illustrates the apparatus as it would appear as the reservoir 2 just finishes its progression across mold 12. After the reservoir 2 is advanced across the mold 12, it is driven back across to its original starting position. Prior to returning the reservoir 2 to its original portion, however, it is advanced beyond the end of mold 12 to allow roller 27 to reach the end of the mold 12 in the y-direction. As the swing arm 26 is returned to its original position, roller 27 rolls over the solder balls in the mold 12. The roller 27 does not contact the balls on the original, forward, pass of the swing arm 26 because during this forward pass it is raised above the top of the solder balls. Vertically mounted air cylinder and slide assembly 28 is actuated prior to the return of the swing arm 26, pressing the roller 27 down onto the top of the mold 12. This flattens the portion of the solder balls extending above the top plane of the mold 12 and also secures the solder balls snuggly into the mold 12. During the return pass, balls in the feeder exit ports 6 of the reservoir 2 simply roll back over the flattened solder balls which occupy the cavity mouths 15. After the swing arm 26 is returned to its original position, the mold 12 is advanced and the process is repeated with the next mold.

In an alternative embodiment, the roller 27 may be actuated on the forward pass of the swing arm 26, following the reservoir 2 on its forward pass. Alternatively, the roller 27 may be used on both the forward and return passes of the swing arm 26.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An apparatus for manipulating solder balls, the apparatus comprising:

a mold having cavities adapted to receive the solder balls;

a swing arm moving between a first and a second position across the mold;

a reservoir attached to the swing arm and having a front surface, a back surface, a bottom surface, and a plurality of vertical columns, each vertical column leading to a respective feeder exit port and being aligned in a first direction along the front surface, wherein the vertical columns are in communication with the bottom surface of the reservoir; and a roller attached to the swing arm and mounted such that when the swing arm is in the first position, the reservoir is between the roller and the mold and when the swing arm is in the second position, the roller is between the mold and the reservoir.

2. The apparatus of claim 1 further comprising a vacuum chuck.

3. The apparatus of claim 1 wherein the mold is constructed of graphite.

4. The apparatus of claim 1 wherein the bottom surface of the reservoir has channels aligned in a second direction to allow gravity to carry the solder balls into the feeder exit ports, the channels having a width greater than the diameter of the solder balls.

5. The apparatus of claim 1 wherein the bottom surface of the reservoir slopes downward in a third direction from the back surface to the front surface of the reservoir.

6. The apparatus of claim 1 further comprising an air supply line connected to the front surface of the reservoir.

7. The apparatus of claim 1 further comprising a vibrator mounted to the reservoir.

8. An apparatus for manipulating solder balls, the apparatus comprising:

a mold having cavities adapted to receive the solder balls;

a swing arm moving between a first and a second position across the mold;

a reservoir attached to the swing arm and having a front surface, a back surface, a bottom surface, and a plurality of vertical columns, each vertical column leading to a respective feeder exit port and being aligned in a first direction along the front surface, wherein the vertical columns are in communication with the bottom surface of the reservoir;

an air supply line connected to the front surface of the reservoir and blowing air onto the solder balls in the reservoir;

a vacuum chuck supporting the mold and drawing air through the cavities of the mold to facilitate reception of the solder balls into the cavities of the mold; and a roller attached to the swing arm and mounted such that when the swing arm is in the first position, the reservoir is between the roller and the mold and when the swing arm is in the second position, the roller is between the mold and the reservoir.

9. The apparatus of claim 8 wherein the mold is constructed of graphite.

10. The apparatus of claim 8 wherein the bottom surface of the reservoir has channels aligned in a second direction to allow gravity to carry the solder balls into the feeder exit ports, the channels having a width greater than the diameter of the solder balls.

11. The apparatus of claim 8 wherein the bottom surface of the reservoir slopes downward in a third direction from the back surface to the front surface of the reservoir.

12. The apparatus of claim 8 further comprising a vibrator mounted to the reservoir.

13. An apparatus for manipulating solder balls, the apparatus comprising:

a graphite mold having cavities adapted to receive the solder balls;

a swing arm moving in a second direction between a first and a second position across the mold;

a reservoir attached to the swing arm and having:
   (a) a front surface,
   (b) a back surface,
   (c) a plurality of vertical columns, each vertical column leading to a respective feeder exit port and being aligned in a first direction along the front surface, wherein the vertical columns are in communication with the bottom surface of the reservoir, and
   (d) a bottom surface sloping downward in a third direction from the back surface to the front surface of the reservoir and having channels aligned in a second direction to allow gravity to carry the solder balls into the feeder exit ports, the channels having a width greater than the diameter of the solder balls;

a vibrator mounted to the reservoir;

an air supply line connected to the front surface of the reservoir and blowing air onto the solder balls in the reservoir;

a vacuum chuck supporting the mold and drawing air through the cavities of the mold to facilitate reception of the solder balls into the cavities of the mold; and a roller attached to the swing arm and mounted such that when the swing arm is in the first position, the reservoir is between the roller and the mold and when the swing arm is in the second position, the roller is between the mold and the reservoir.

\* \* \* \* \*